(12) United States Patent
Radkevich et al.

(10) Patent No.: US 7,195,671 B2
(45) Date of Patent: Mar. 27, 2007

(54) THERMAL SHIELD

(75) Inventors: Olexy V. Radkevich, Schaumburg, IL
(US); Dennis Persyk, Barrington, IL
(US); Volodimir Protsenko, Hoffman
Estates, IL (US)

(73) Assignee: Siemens Medical Solutions USA, Inc.,
Malvern, PA (US)

( * ) Notice: Subject to any disclaimer, the term of this
patent is extended or adjusted under 35
U.S.C. 154(b) by 69 days.

(21) Appl. No.: 10/949,236

(22) Filed: Sep. 24, 2004

(65) Prior Publication Data

US 2005/0115493 A1 Jun. 2, 2005

(51) Int. Cl.
*C30B 35/00* (2006.01)

(52) U.S. Cl. .................... 117/217; 117/13; 117/218; 117/900

(58) Field of Classification Search .............. 117/13, 117/15, 217, 218, 900
See application file for complete search history.

(56) References Cited

U.S. PATENT DOCUMENTS

| | | | | |
|---|---|---|---|---|
| 5,853,480 | A | * | 12/1998 | Kubota et al. ............. 117/217 |
| 5,868,836 | A | * | 2/1999 | Nakamura et al. .......... 117/208 |
| 5,922,127 | A | * | 7/1999 | Luter et al. ................. 117/207 |
| 5,997,635 | A | * | 12/1999 | Kubota et al. ............... 117/14 |
| 6,071,341 | A | * | 6/2000 | Shimanuki et al. ......... 117/208 |
| 6,179,911 | B1 | * | 1/2001 | Tomioka et al. ............. 117/20 |
| 6,482,263 | B1 | * | 11/2002 | Ferry et al. ................. 117/217 |

* cited by examiner

*Primary Examiner*—Felisa Hiteshew

(57) ABSTRACT

An apparatus for growing crystals includes a sealed chamber having a crucible assembly and a seed holder disposed therein. The crucible assembly is adapted to contain a melt therein and the seed holder is selectively positionable within the chamber from a first position relative to the crucible assembly to at least one subsequent position within the crucible assembly. A heater is configured and dimensioned to heat the melt disposed within the crucible assembly and an insulator is included for insulating the heater and the crucible. An actuator rotates at least one of the crucible assembly and the seed holder relative to the other and a support ring suspends the crucible assembly within the sealed chamber. A ceramic thermal shield is disposed atop the support ring and regulates the heat loss from the crucible assembly to an upper portion of the chamber.

10 Claims, 6 Drawing Sheets

THERMAL SHIELD

BACKGROUND

The present invention relates to an apparatus for growing single crystals by pulling the single crystals from a melt on a seed. More particularly, the present invention relates to a thermal shield which can be used with a crystal growing apparatus for more effectively growing single crystals from a melt.

TECHNICAL FIELD

Various types of crystals, e.g., sodium chloride, potassium chloride, potassium bromide, lithium fluoride, sodium iodide, cesium iodide, germanium, silicon, lead tellurides, etc., used for optics and semi-conductors are typically grown from a melt or raw material which forms on a seed under controlled chemical conditions.

The Czochralski technique for growing crystals is one technique which originates from the pioneering work of Jan Czochralski in 1917 who first managed to successfully pull single crystals of various metals. Since then the Czochralski technique has been used to grow germanium and silicon and has been extended to grow a wide range of compound semiconductors, oxides, metals, and halides. It is considered the dominant technique for the commercial production of most of these materials. Generally, the process involves the vertical pulling of a seed crystal when contacted with the surface of a molten reservoir of the raw material which is then gradually pulled upwardly with rotation to form the single crystal.

More particularly, the Czochralski technique typically involves the following steps:

filling a suitable crucible with the raw material, e.g., Silicone (Si);

dissolving the raw material in the crucible and keeping its temperature close to the melting point.

inserting a seed crystal while rotating the crucible and adjusting the temperature to start withdrawing the seed crystal (during the first or initial pull, the diameter of the growing crystal will decrease to a few millimeters which is known as the "dash process" which ensures that the crystal will be dislocation free even though the seed crystal may contain some dislocations);

adjusting the growth rate to grow the commercial part of the crystal at a few mm/second at a desired diameter;

Adjusting the temperature, pull rate and rotational speed to maintain the homogeneity of the crystal until the melt is almost exhausted; and Increasing the pull rate to reduce the diameter of the crystal and establish an "end cone" which signifies the end of homogeneous crystal growth.

It is important to note that as the crystal grows the impurity concentration of the melt increases which results in a higher percentage of impurities in the crystal. Moreover, as the amount of the impurities increases, the temperature profile will also change, i.e., the crystal tends to cool more slowly as you grow deeper into the crucible. In addition and depending upon the type of material being grown, other parameters may have to be controlled to yield a desired result.

It is known that obtaining single crystals with pre-selected properties and perfect crystalline structure is dependent on a host of complicated parameters such as providing stability and axial symmetry of the temperature field in the growing single crystal and the melt surrounding it; maintaining the present solid-liquid interface shape; providing adequate agitation of the melt to wash over the solid-liquid interface; and providing a stable growth rate at the predetermined diameter of the growing single crystal.

Other issues may also arise during crystal growth of a particular material. For example, some compounds may require a very high pressure which must be maintained around the growing crystal area to control the vaporization of a volatile component such as arsenic or phosphorus. In other crystal growing processes, it may be necessary to supply a moderate to high vacuum. Typically, the working zone within the crystal growing apparatus includes some sort of relief valve or is evacuatable to permit control of the zone atmosphere, whether it is pressurized or evacuated during crystal growth.

One particular known apparatus for pulling single crystals from melt on a seed by the Czochralski method includes a sealed chamber with water-cooled walls and a crucible disposed therein such that the vertical axis of the crucible is aligned with the vertical axis of the chamber. The crucible is enclosed within a heater encompassed by a thermal insulator. The upper portion of the chamber accommodates a vertical rod having an axis which is aligned with that of the crucible axis. The rod is sealingly received through the top or lid of the chamber and is axially reciprocable. The lower end of the rod carries the seed holder, while its upper end is associated with a rotator which rotates and axially reciprocates the rod.

The initial material is melted in the crucible and the rotating rod with the seed is lowered into the crucible until the seed comes into contact with the melt. The melt temperature is somewhat lowered to discontinue the melting of the seed and thereafter the rod with the seed is slowly pulled while rotated to grow a single crystal on the seed. The diameter is predetermined by correspondingly adjusting the melt temperature and/or the pull rate.

Although the above described known apparatus enables the growth of single crystals of high quality, the above apparatus has some disadvantages which include: impaired axial symmetry of the temperature field of the melt in the crucible; and limited agitation of the melt by simple rotation of the growing single crystal. It is known that asymmetry of the temperature field in the crucible may result in crystallization of the melt on its walls which is also undesirable for many reasons known in the art. Further, asymmetry of the temperature field of the melt may impede the growth rate of the crystal.

Other apparatuses such as the apparatus described in U.S. Pat. No. 3,865,554 includes a sealed chamber with a rotating seed holder rod arranged coaxially with the chamber. A rotatable crucible is supported by a mount with a sealed vertical rod which extends (coaxially) through the bottom of the chamber. The crucible and the stand are enclosed within a heater which is substantially encompassed in a thermal insulator. A single crystal is pulled by simultaneously rotating both the rod of the seed holder and the crucible with the melt. This particular apparatus provides axial symmetry of the temperature field of the melt in the crucible and intense agitation through dual rotation. However, due to the intense withdrawal of heat from the bottom rod, the temperature of the central part of the crucible bottom tends to be lower than at the periphery of the crucible. This uneven temperature differential typically results in parasitic crystallization at the bottom of the crucible which may become particularly pronounced when pulling large single crystals. These conditions can detrimentally effect the planar crystallization of the crystals.

U.S. Pat. No. 4,235,848 relates to a so-called "Rost" furnace for pulling a single crystal from a melt on a seed and includes a sealed chamber having a crucible operatively connected with a drive to effect rotation of the crucible. This patent attempts to solve many of the known problems with shaping the temperature field and reducing pollution of the melt during the crystallization process. A heater with a thermal insulator encloses the crucible and a coaxially arranged rod carries a seed holder which is vertically displaceable relative to the crucible. The crucible and its rotational drive includes a support ring which mounts the crucible thereon for joint rotation during the operation of pulling the single crystal.

Since the crucible is mounted on the rotating support ring, the heat can be supplied to the entire crucible surface for optimum conductivity and the temperature field can be shaped in the melt contained in the crucible without affecting the axial symmetry of this field. According to the '848 specification, the arrangement of the crucible on the rotary support ring tends to impede pollution of the melt within the crucible material and parasitic crystallization at the bottom of the crucible.

One of the disadvantages of the above described apparatus is its underlying inability to isolate the upper, cold chamber and the lower, hot chamber. It is known that good heat isolation leads to better growth conditions. For example, it is known that the feed system of the Rost furnace is a critical process area. More specifically, thallium NaI powder is fed from hoppers into an annular well, or moat, surrounding the crucible. Within this well the fed powder melts and flows into the main melt of the crucible from which the crystal is pulled.

The temperature equilibrium is very critical with respect to the feeding liquid and the pulling melt. If the feeding liquid is too hot it will influence the pulling melt and cause the crystal to grow in an unstable manner. This is due to unfavorable convection currents of the hot liquid, which render the liquid-solid interface shape unstable. If, on the other hand, the feeding liquid is too cool, it can crystallize out in the feeding channels in route to the pulling melt and block passage into the pulling melt.

Another important parameter relating to the crystal growing process is so-called "snow formation". Snow is jargon for condensed natural anodized aluminum (NaI) which has the appearance of snow. The NaI can condense on cool surfaces and build up rapidly. Once snow formation has commenced, the snow accretes rapidly. The snow is an insulator and can quickly upset the heat distribution within the growth zone. It can also block the passage of NaI feeding powder and liquid. In the past, snow blockages have been remedied by increasing side heater power to melt the snow. This however creates the undesirable condition described above of overly hot feed liquid being introduced into the pulling melt.

Another important feature of the above process is the axial temperature gradient. It is desirable to have a large axial temperature gradient because it tends to favor more stable crystal growth. A large axial gradient is also known to further decrease the zone of impurity uptake.

One potential solution in the prior art was to utilize the Rost furnace and lay an expensive but somewhat unreliable platinum annulus over the support ring (See FIGS. 5A and 5B). The platinum annulus would be somewhat effective in isolating the two chambers but required constant maintenance and/or replacement during repeated cycles. For example, during crystallization the platinum annulus would tend to develop ripples due to thermal distortion of the platinum during a growth cycle (See FIG. 5A). As a result, the platinum would typically have to be pounded out and/or replaced after a certain number of cycles which is expensive and very time consuming. Moreover, the thermal conductivity of platinum is too high and typically resulted in unfavorable heat distribution which detrimentally effected stable crystal growth.

Metals other than platinum with better thermal distortion properties are typically not a suitable substitute due to the common use of hot NaI which quickly corrodes most metals and which would poison the melt.

Thus, there exists a need to develop an inexpensive and effective way to isolate the upper and lower chambers of a Rost-type furnace to enhance stable and homogeneous crystal growth.

SUMMARY

The present disclosure relates generally to an apparatus for growing crystals and includes a sealed chamber having a crucible assembly and a seed holder disposed therein. The seed holder is selectively positionable within the chamber from a first position relative to the crucible assembly to at least one subsequent position within the crucible assembly. The crucible assembly is adapted to contain a melt therein. A heater is included which is configured and dimensioned to heat the melt disposed within the crucible assembly and an insulator insolates the heater and the crucible assembly. An actuator is provided which rotates the crucible assembly or the seed holder relative to one another. A support ring is included which suspends the crucible assembly within the sealed chamber and a thermal shield made from a ceramic material with a low coefficient of thermal expansion is disposed atop the support ring for regulating the heat loss from the crucible assembly to an upper portion of the chamber.

Preferably, the crucible assembly is disposed in a lower portion of the chamber and the thermal shield limits heat loss from the lower portion of the chamber to an upper portion of the chamber. In one embodiment, the support ring is mounted for rotation within the chamber such that rotation of the support ring rotates the crucible assembly relative to the seed holder.

In another embodiment according to the present disclosure, the thermal shield includes several sections which abut one another to form a generally ring-like annulus. Preferably, the sections are selectively joinable to form annuli of varying diameters.

Another embodiment according to the present disclosure relates to an apparatus for growing crystals and includes a sealed chamber having a crucible assembly and a seed holder disposed therein. The seed holder is selectively positionable within the chamber from a first position relative to the crucible assembly to at least one subsequent position within the crucible assembly. The crucible assembly is adapted to contain a melt therein. A heater is included which is configured and dimensioned to heat the melt disposed within the crucible assembly and an insulator insulates the heater and the crucible assembly. An actuator rotates the crucible assembly or the seed holder relative to one another. A support ring made from a generally ring-like ceramic material having a low coefficient of thermal expansion suspends the crucible assembly within the sealed chamber.

The present disclosure also relates to a method of growing crystals and includes the steps of:

providing a sealed chamber having upper and lower chambers, a crucible assembly, a heater and a seed holder for holding a seed disposed thereon. The crucible assembly is mountable atop a support ring and the heater and the crucible assembly are substantially surrounded by an insulating material;

mounting the crucible assembly atop the support ring in the lower portion of the chamber;

placing a ceramic thermal shield having a low coefficient of thermal expansion atop the support ring to limit heat loss to the upper portion of the chamber;

placing an initial material into a holder within the crucible assembly;

rotating at least one of the crucible assembly and the seed holder relative to the other of the crucible assembly and the seed holder;

establishing an environmental condition within the chamber;

energizing the heater to melt the initial material;

lowering the seed holder into the melt until a preset condition is met; and pulling the seed holder and the seed from the crucible at a predetermined pulling rate to pull a single crystal from the melt having a desired diameter.

Another embodiment according to the present invention relates to a method of growing crystals and includes the steps of:

providing a sealed chamber having a crucible assembly, a heater and a seed holder for holding a seed disposed therein. The crucible assembly is mountable atop a monolithic ceramic support annulus and the heater and the crucible assembly are substantially surrounded by an insulating material;

mounting the crucible assembly atop the monolithic ceramic support annulus; placing an initial material into a holder within the crucible assembly;

rotating at least one of the crucible assembly and the seed holder relative to the other of the crucible assembly and the seed holder;

establishing an environmental condition within the chamber;

energizing the heater to melt the initial material;

lowering the seed holder into the melt until a preset condition is met; and pulling the seed holder and the seed from the crucible at a predetermined pulling rate to pull a single crystal from the melt having a desired diameter.

BRIEF DESCRIPTION OF THE DRAWINGS

Various embodiments of the subject apparatus are described herein with reference to the drawings wherein.

DETAILED DESCRIPTION

Figure 1A:
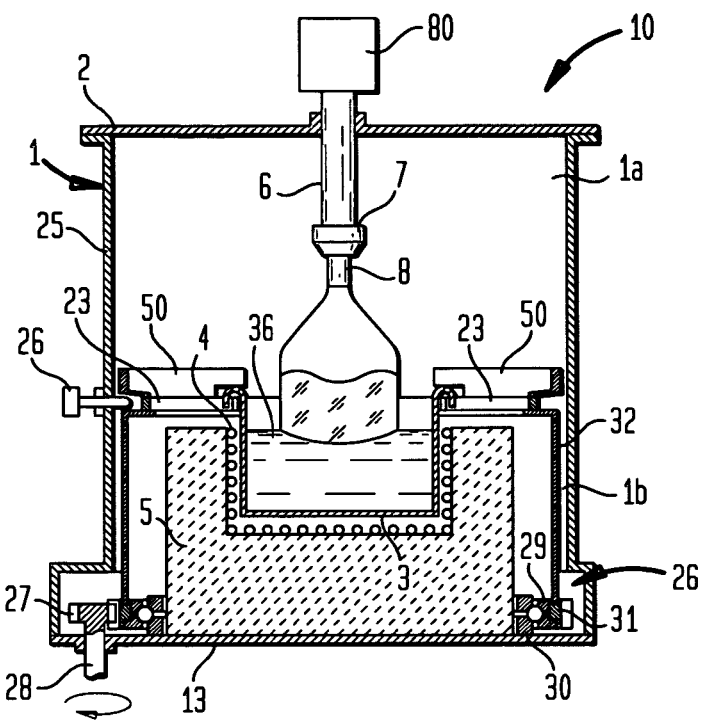
FIG. 1A is a schematic, cross sectional view of a thermal shield for use with an apparatus for pulling a single crystal from a melt on a seed in accordance with the present disclosure.
Figure 1B:
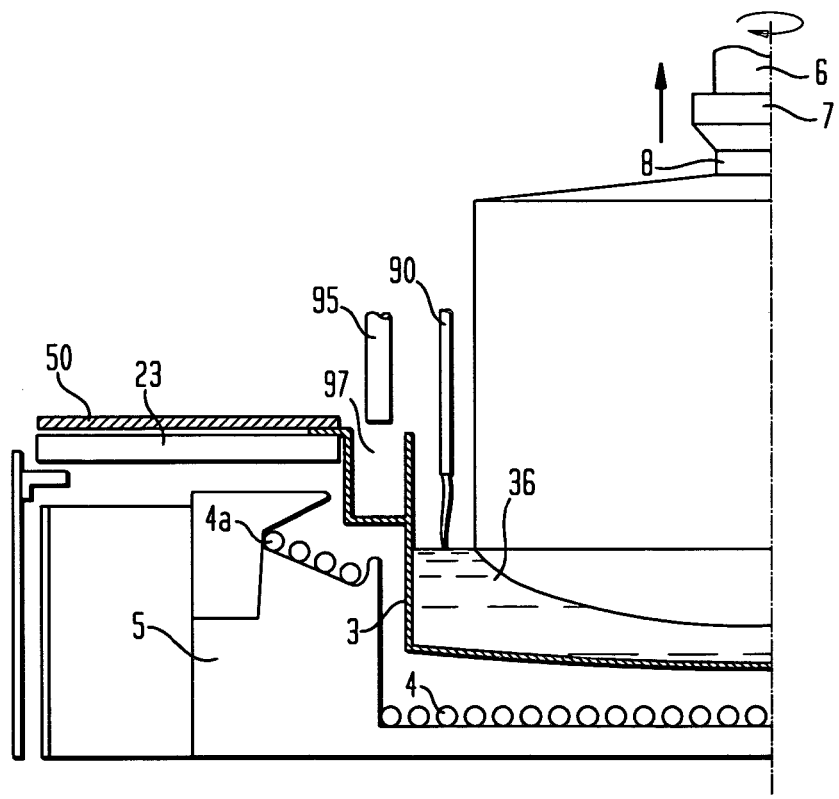
FIG. 1B is another schematic cross sectional view of the thermal shield for use with a slightly different apparatus for pulling a single crystal from a melt on a seed in accordance with the present disclosure.
Figure 1C:
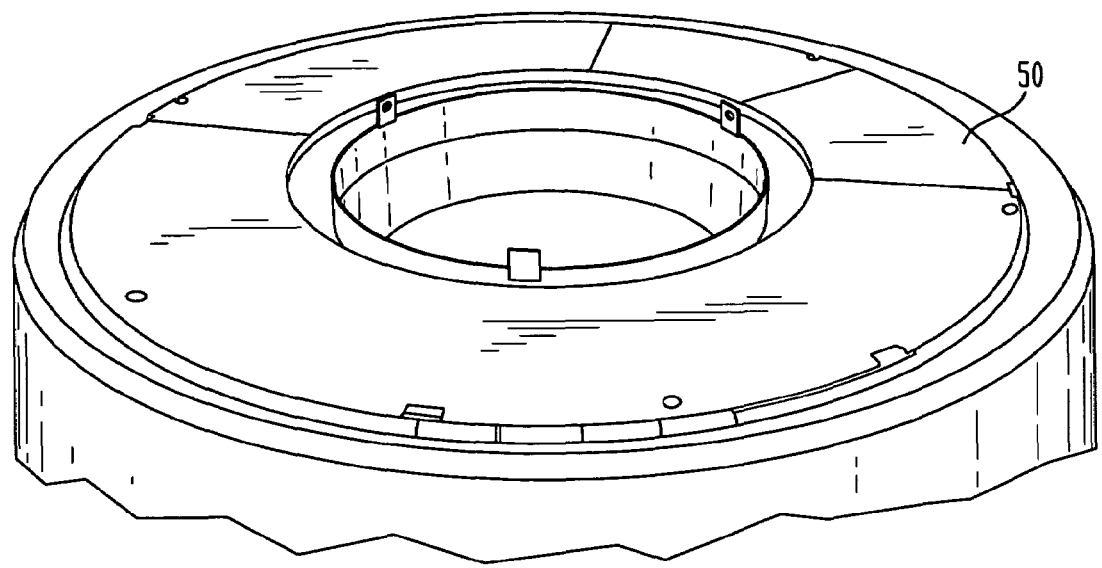
FIG. 1C is a top perspective view of the thermal shield of FIGS. 1A and 1B.

Turning initially to FIGS. 1A–1C therein is shown one embodiment of the presently disclosed thermal shield 50 for use with an apparatus 10 for pulling a single crystal from a melt. For the purposes herein, it is envisioned that any known melt may be used from which a single crystal may be pulled, e.g., semi-conductive silicon, alkali halide (e.g., sodium chloride) or a solid solution of tin and lead tellurides. Apparatus 10 is schematically shown and in general includes a sealed chamber 1 with a lid 2. The sealed chamber 1 accommodates a crucible 3 therein which is operatively connected with a drive mechanism 28 for effecting rotation thereof. The crucible contains a melt 36 of the raw crystal material. A heater 4 is included which has an insulator 5 which substantially encloses the crucible 3 and which keeps the temperature of the melt 36 within the crucible 3 at or close to the melting point of the particular melt 36.

An upper portion 1a of the chamber 1 accommodates a rod 6 having an axis which is aligned with that of the axis of the crucible 3. The rod 6 is sealingly received through the lid 2 of the chamber 1 and is axially reciprocable and selectively rotatable. The lower end of the rod 6 carries the holder 7 of a seed 8, while its upper end is associated with an actuator 80 which rotates and axially reciprocates rod 6.

It is envisioned that the insulator 5 may be made from any known suitable insulating material such as graphite The crucible material may be quartz, boron nitride, platinum, silicon nitride, etc. Preferably, the holder 7 of the seed 8 is made of graphite or other appropriate materials.

The operative connection between the crucible 3 and its rotation includes a support ring 23 which suspends the crucible 3 therefrom. Rotation of the support ring 23, in turn, rotates the crucible 3. Rotation of the crucible 3 relative to the seed 8 and seed holder 7 is known to promote homogeneity in the growth of the crystal. Joint rotation of the seed 8 and the seed holder 7 also agitates the melt 36 and tends to produce more homogeneous crystal growth. Further, rotating the crucible 3 at any speed in the direction opposite to that of the rotation of the growing single crystal, enables one to effectively control the shape of the solid-liquid interface process and the degree of the agitation of the melt 36.

The crucible 3 is supported by the support ring 23 with aid of hooks 24 provided at the top of the crucible 3. At the horizontal level of the support ring 23, extending sealingly into the chamber 1 through its side wall 25 is a pusher 26 provided for adjusting the position of the crucible 3 in the chamber 1.

The operative connection between the crucible 3 and the drive for the crucible's 3 rotation includes (in addition to the support ring 23 accommodated in the chamber 1) a bearing 26 and a reducing gear of which a driving pinion 27 is mechanically engaged with an output shaft 28 of the rotation drive (not shown) arranged outside the chamber 1. The shaft 28 sealingly extends into the bottom 13 of chamber 1. The bearing 26 includes a rotatable race 29 and a stationary race 30 secured at the bottom 13 of the chamber 1 coaxially with the rod 6 of the holder 7 of the seed 8. The drive member of the reducing gear is in the form of a toothed rim 31 fastened about the rotatable race 29 of the bearing 26 and connected with the support ring 23 for rotating the latter jointly with the crucible 3.

As best shown in FIG. 1A, a cylindrical stand 32 carries the support ring 23 and has its bottom end secured to the toothed rim 31 coaxially therewith, so that the stand 32 encompasses the heater 4 and the thermal insulator 5. The support ring 23 is carried by the stand 32 with adjustment-wise displacement in a horizontal plane relative to the axis of the rod 6 of the holder 7 of the seed 8. As best seen in FIG. 2B, the support ring 23 includes two concentric thin-wall rims, i.e., an inner rim 33 and an outer rim 34 interconnected with spokes 35 which are uniformly circumferentially spaced and extend tangentially to the inner ring 33.

FIGS. 1A–1C and 2A show one embodiment of the ceramic thermal shield 50 which is designed and configured to be laid on top of the support ring 23. Preferably, the thermal shield 50 is made from a ceramic material having a low coefficient of thermal expansion and high stability at extreme temperatures such as the various ceramics manufactured by Zicar® Ceramics of Florida, New York.

The ceramic thermal shield 50 successfully inhibits NaI or snow accumulation in the molt of feed liquid which surrounds the crucible which is known to quickly upset the heat distribution within the growth zone. Snow accumulation can also block the passage of NaI feeding powder and liquid. In the past snow blockages have been remedied by increasing side heater power to melt the snow (NaI). This, however, creates the undesirable condition of overly hot feed liquid being introduced into the pulling melt. The ceramic thermal shield 50 inhibits NaI build-up by capturing the heat within the well such that snow accumulation is retarded to an acceptable level. The incorporation of the ceramic thermal shield 50 also increases the thermal gradient in the axial direction by virtue of its insulating effect which is also known to promote stable crystal growth.

Yet another feature of the ceramic thermal shield 50 is its ability to prevent loss of heater power to the upper regions of the furnace, that is, the upper chamber 1a. Prior to incorporation of the thermal shield 50, excess power was required of the side and bottom heaters 4a and 4, respectively, because of heat loss via the surface of support ring 23. The reduced power results in more stable growth conditions as evidenced by monocrystaline ingots with solid-liquid interface surfaces of favorable shape. These advantages are well recognized by those skilled in the art of crystal growing.

It is envisioned that the incorporation of the ceramic thermal shield 50 increases the thermal gradient in the axial direction by virtue of its insulating effect. Moreover, the ceramic thermal shield 50 allows a large axial temperature gradient between the upper and lower chambers 1a and 1b, respectively, which favors stable crystal growth. In addition, it is contemplated that the large temperature gradient which results when utilizing a ceramic thermal shield 50 decreases the zone of impurity uptake.

Figure 2A:
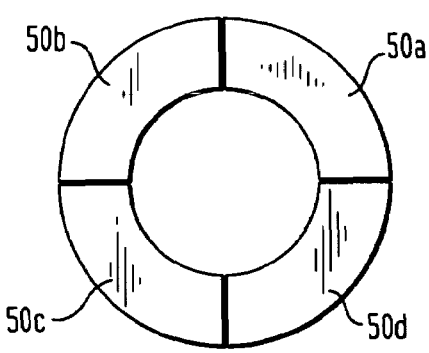
FIG. 2A is a top view of one embodiment of the thermal shield wherein the thermal shield includes a series of sectors which abut one another to form a ring.
Figure 2B:
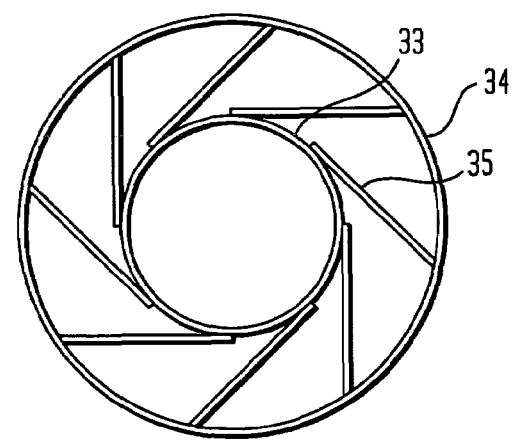
FIG. 2B is a top view of one embodiment of a support ring which supports a crucible within the apparatus for pulling a crystal.

In one embodiment, the ceramic thermal shield 50 is fashioned from the combination of several small sectors 50a, 50b, 50c and 50d which are arranged end-to-end to form a thermal ring-like shield 50 (See FIG. 2A). As can be appreciated, rings of varying diameters can be easily assembled to optimize the desirable effects of the ceramic thermal shield 50. Moreover, the shape and size of the ceramic thermal shield 50 can be quickly modified to suit a particularly-sized chamber 1.

Figure 3A:
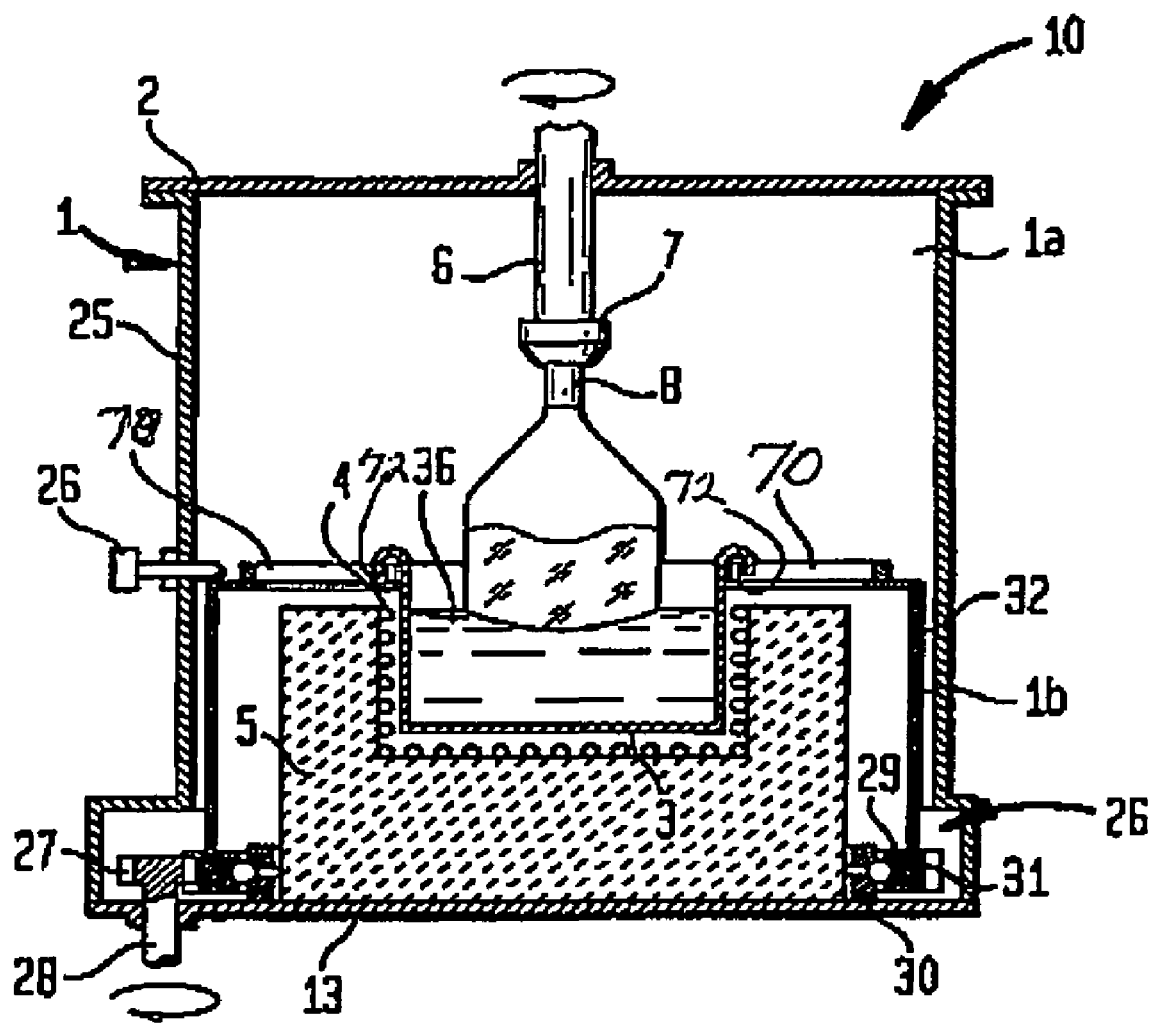
FIG. 3A is a schematic, cross sectional view of another embodiment of the present disclosure showing a monolithic ceramic thermal which is designed to support a crucible which contains the melt.
Figure 3B:
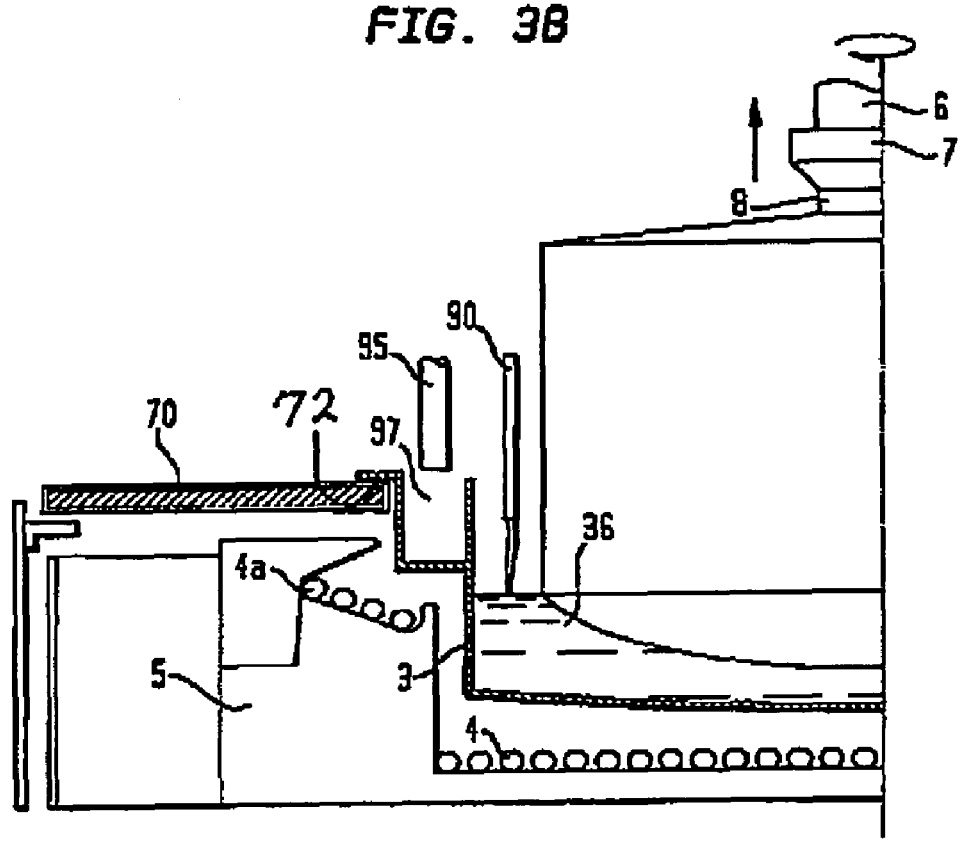
FIG. 3B is another schematic, cross sectional view of the monolithic ceramic thermal shield for use with a slightly different apparatus for pulling a single crystal from a melt on a seed.
Figure 3C:
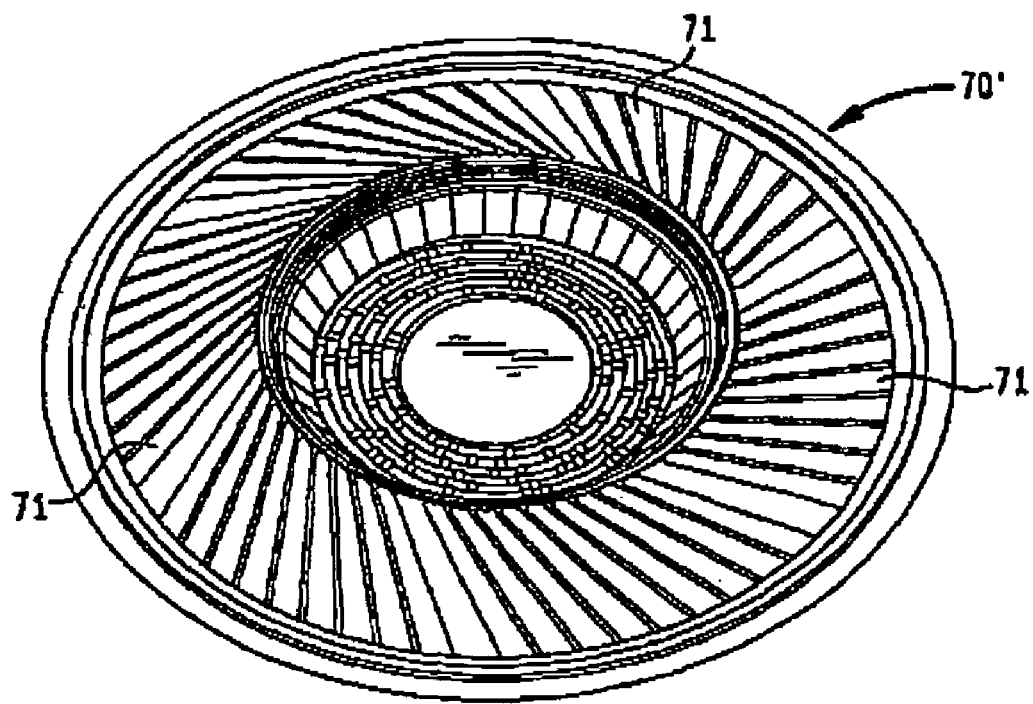
FIG. 3C is a top perspective view of a thermal shield which is designed to support the crucible and which includes a thermo-isolator disposed between spokes.

FIGS. 3A and 3B show another embodiment according to the present disclosure and includes a monolithic ceramic thermal shield 70 which is designed to support the crucible 3. More particularly, ceramic thermal shield 70 is positioned atop the support stand 32 and replaces the spoked wheel support ring 23 known in the prior art (See FIGS. 4A and 4B). The crucible 3 essentially hooks over the inner ring 72 of the ceramic shield 70 much in the same manner as described in FIG. 1A. In addition, both the ceramic shield 70 and the crucible 3 are arranged to rotate by virtue of the same or similar drive means as described above with respect to FIG. 1A, i.e., a bearing 26 and a reducing gear of which a driving pinion 27 is mechanically engaged with an output shaft 28 of the rotation drive (not shown) arranged outside the chamber 1. As can be appreciated, the ceramic shield 70 should be made of a ceramic material of sufficient strength to support the mass of the crucible 3 and the melt 36. FIG. 3C shows another possible embodiment wherein the thermal shield 70' includes a spoked wheel design having a ceramic thermo-isolator 71 disposed therebetween.

Figure 4A:
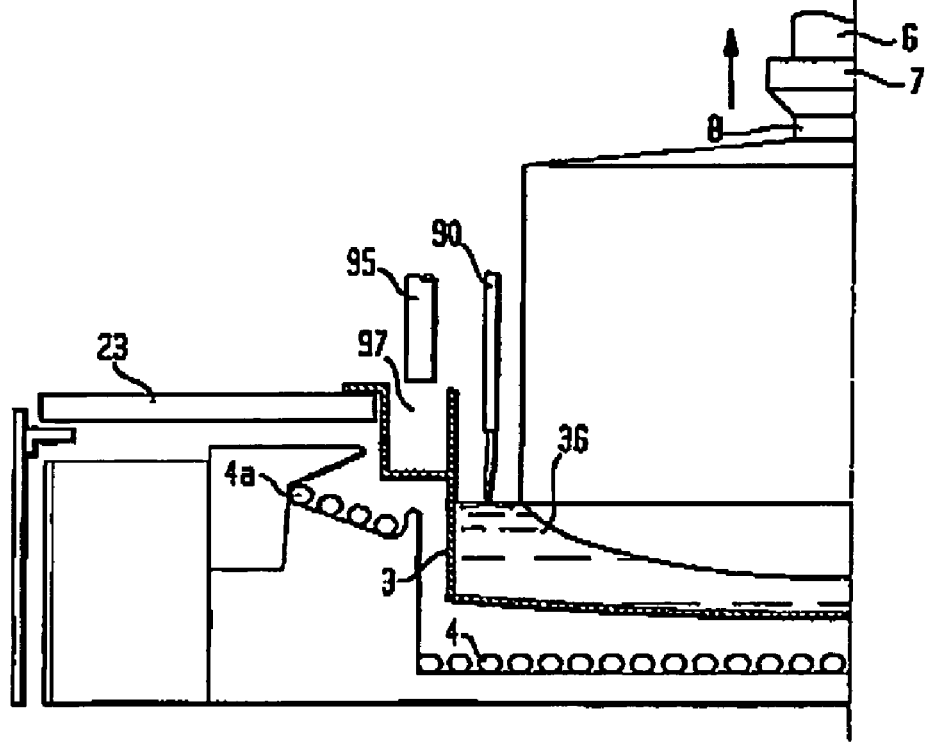
FIG. 4A is a schematic cross sectional view of a spoked wheel supporting ring in accordance with a prior art disclosure.
Figure 4B:
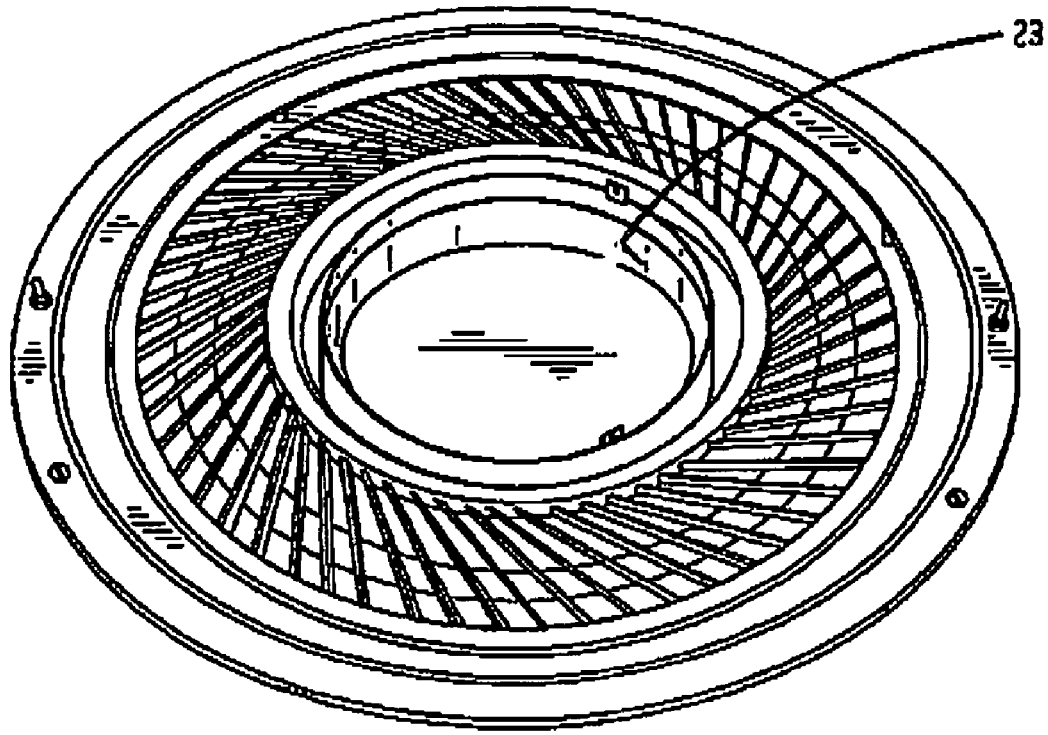
FIG. 4B is a top view of the spoked wheel supporting ring of FIG. 4A.

The monolithic ceramic support shield 70 has two distinct advantages over the prior art spoked wheel or "toothed rim" design of the support ring 23 of the prior art as shown in FIGS. 4A and 4B. The toothed rim construction is not reliable over long periods of use since this type of construction is not stable against large temperature excursions which are typically encountered during a growth cycle. In fact, the toothed rim design is known to deform over long use requiring frequent repair or replacement. The monolithic ceramic support shield 70 can withstand large temperature fluctuations with limited deformation.

Second, the toothed rim design of the support ring 23 has a larger coefficient of thermal expansion which directly effects the overall clearances of the support ring 23 when taking into effect rotation, i.e., the clearances must be greater with the toothed rim design to take into account for thermal expansion and prevent accidental contact with the sides of the chamber 1 during rotation as the temperature is increased from room temperature to approximately 700° C. In contrast, the monolithic ceramic support ring 70 has a very low coefficient of thermal expansion at elevated temperatures and, as such, the clearances can be reduced which directly reduces heat loss to the upper chamber 1a during the growing process.

Moreover, the monolithic ceramic support ring 70 isolates the upper and lower chamber 1a and 1b, respectively, and reduces radial heat loss which couples with an increase in radial temperature gradient. Much like above with respect the thermal shield 50 of FIG. 1A, a large radial temperature gradient favors stable crystal growth and decreases the zone of impurity uptake.

Figure 5A:
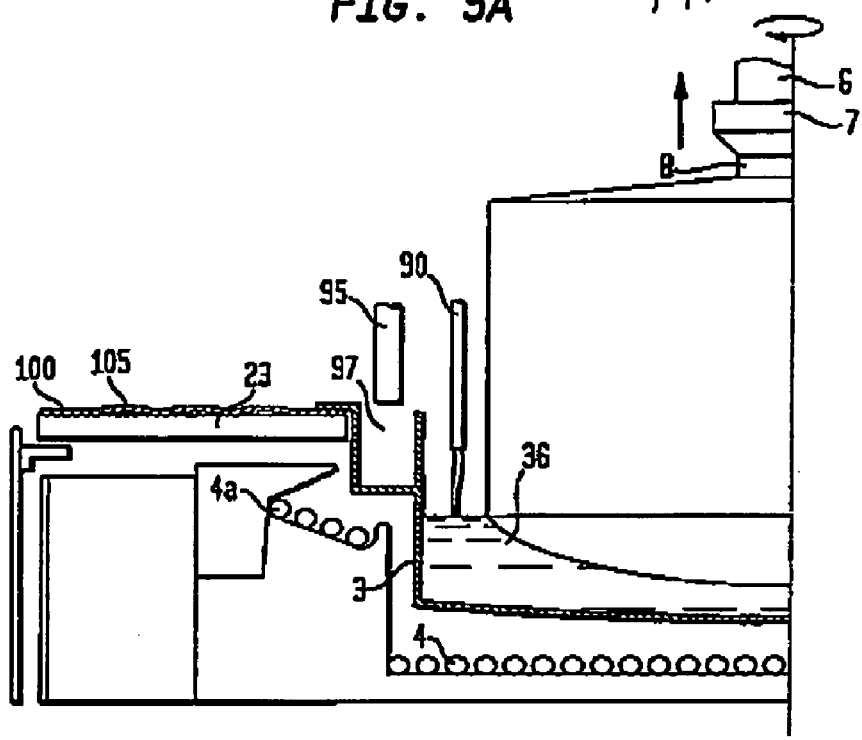
FIG. 5A is a schematic cross sectional view of a platinum shield in accordance with a prior art disclosure.
Figure 5B:
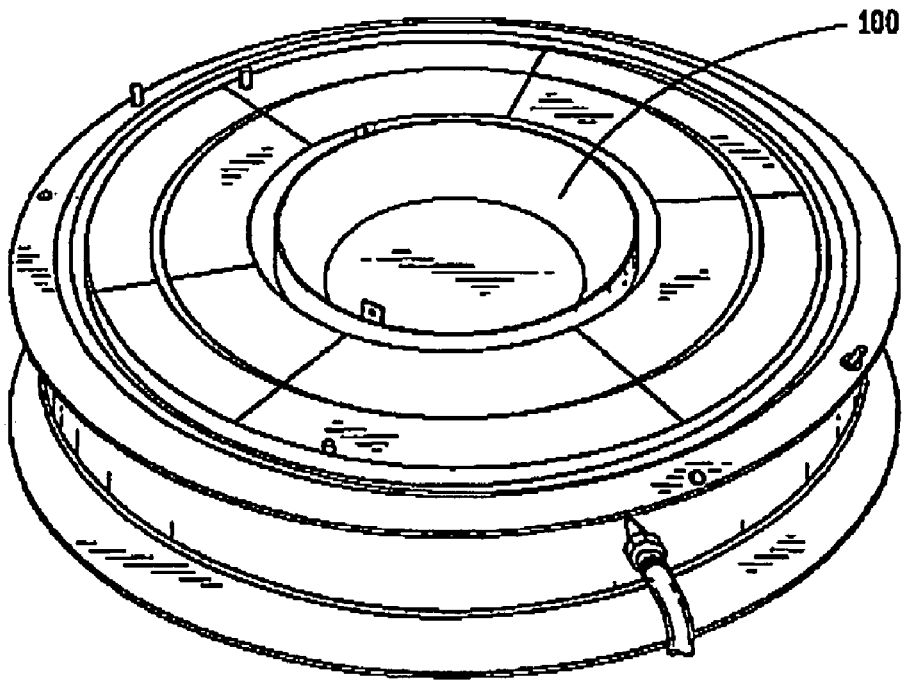
FIG. 5B is a top view of the platinum shield supporting ring of FIG. 5A.

As can be appreciated by the present disclosure, the monolithic ceramic support ring 70 is much more reliable than the platinum annulus 100 of the prior art (See FIGS. 5A and 5B) which is very expensive and which requires constant maintenance and/or replacement after repeated cycles. Moreover, during crystallization the platinum annulus tends to develop ripples 105 due to thermal distortion of the platinum during a growth cycle (See FIG. 5A). As a result, the platinum annulus 100 typically has to be pounded out and/or replaced after a certain number of cycles which is expensive and very time consuming. In addition, the thermal conductivity of platinum is too high and typically results in unfavorable heat distribution which detrimentally effects stable crystal growth.

In use and with respect to FIGS. 1A–1C, the crucible 3 is mounted on the support ring 23, and the initial raw material is charged into the crucible 3. A sensor 90 is included which can measure the level of the melt 36 and/or the temperature of the melt 36. A feeder tube 95 introduces material thallium NaI powder (or the like) into a peripheral annul 97 surrounding the crucible 3. Then the rotation drive of the crucible 3 is energized to transmit the driving torque from the output shaft 28 to the crucible 3 via the driving pinion 27, the toothed rim 31, the cylindrical stand 32 and the support ring 23. The set screw or pusher 26 is utilized to center the crucible 3 jointly with the support ring 23 such that the axis of the crucible 3 is aligned with the axis of the support ring's 23 rotation and aligned with the axis of the rod 6 of the seed holder 7 (See FIG. 1A). The seed 8 is then secured in the holder 7 and the actuator 80 is energized to lower the rod 6. The heater 4 (and side heater 4a of FIG. 1B) is energized to melt the initial material disposed in the crucible 3. The seed 8 is slowly lowered until it comes into contact with the initial material when melted, i.e., the melt 36.

Following the partial melting-over of the seed 8 and establishment of a balanced state between the seed 8 and the melt 36, i.e. the state where neither melting of the seed 8 nor crystallization of the melt thereon takes place, the actuator 80 is again energized to raise and rotate the rod 6 with the seed holder 7. As can be appreciated, controlling the pulling rate of the actuator 80 is indirectly proportional to the diameter of the single crystal, i.e., the lower (or slower) the pull rate the larger the crystal.

The present disclosure also relates to a method of growing single crystals and includes the steps of:

providing a sealed chamber 1 having upper and lower chambers 1a and 1b, respectively, a crucible assembly 3, a heater 4 and a seed holder 7 for holding a seed 8 disposed therein. The crucible assembly 3 is mountable atop a support ring 23 and the heater 4 and the crucible assembly 3 are substantially surrounded by an insulating material 5.

mounting the crucible assembly 3 atop the support ring 23 in the lower portion 1b of the chamber 1;

placing a ceramic thermal shield 50 having a low coefficient of thermal expansion atop the support ring 23 to limit heat loss to the upper portion 1a of the chamber 1;

placing an initial material 36 into a holder within the crucible assembly;

rotating at least one of the crucible assembly 3 and the seed holder 7 relative to the other of the crucible assembly 3 and the seed holder 7;

establishing an environmental condition within the chamber 1;

energizing the heater 4 (and side heater 4a if applicable) to melt the initial material 36;

lowering the seed holder 7 into the melt 36 until a preset condition is met; and pulling the seed holder 7 and the seed 8 from the crucible assembly 3 at a predetermined pulling rate to pull a single crystal from the melt 36 having a desired diameter.

Another embodiment according to the present invention relates to a method of growing crystals and includes the steps of:

providing a sealed chamber 1 having a crucible assembly 3, a heater 4 and seed holder 7 for holding a seed 8 disposed therein. The crucible assembly 3 being mountable atop a monolithic ceramic support annulus 70 and the heater 4 and the crucible assembly 3 being substantially surrounded by an insulating material 5;

mounting the crucible assembly 3 atop the monolithic ceramic support annulus 70;

placing an initial material 36 into a holder within the crucible assembly 3;

rotating at least one of the crucible assembly 3 and the seed holder 7 relative to the other of the crucible assembly 3 and the seed holder 7;

establishing an environmental condition within the chamber 1;

energizing the heater 4 (and side heater 4a if applicable) to melt the initial material 36;

lowering the seed holder 7 into the melt 36 until a preset condition is met; and pulling the seed holder 7 and the seed 8 from the crucible assembly 3 at a predetermined pulling rate to pull a single crystal from the melt 36 having a desired diameter.

As can be appreciated, the incorporation of a ceramic thermal shield 50 (or 70) effectively prevents the loss of heat to the upper portion 1a of the chamber, increases the thermal gradient in the axial direction and inhibits NaI accumulation which all contribute to stable and homogeneous single crystal growth.

From the foregoing and with reference to the various figure drawings, those skilled in the art will appreciate that certain modifications can also be made to the present disclosure without departing from the scope of the same. While several embodiments of the disclosure have been shown in the drawings, it is not intended that the disclosure be limited thereto, as it is intended that the disclosure be as broad in scope as the art will allow and that the specification be read likewise. Therefore, the above description should not be construed as limiting, but merely as exemplifications of preferred embodiments. Those skilled in the art will envision other modifications within the scope and spirit of the claims appended hereto.

What is claimed is:

1. An apparatus for growing crystals, comprising:

a sealed chamber having a crucible assembly and a seed holder disposed therein, said seed holder being selectively positionable within said chamber from a first position relative to said crucible assembly to at least one subsequent position within said crucible assembly, said crucible assembly adapted to contain a melt therein;

a heater sufficiently configured and dimensioned to heat said melt disposed within said crucible assembly;

an insulator for insulating said heater and said crucible assembly;

an actuator for rotating at least one of said crucible assembly and said seed holder relative to the other;

a support ring for suspending said crucible assembly within said sealed chamber; and a thermal shield disposed atop said support ring for regulating the heat loss from the crucible assembly to an upper portion of said chamber, said thermal shield having at least one wall made from a ceramic material having a low coefficient of thermal expansion and providing insulation primarily from above said crucible assembly.

2. An apparatus for growing crystals according to claim 1 wherein said support ring is mounted for rotation within said chamber such that rotation of said support ring rotates said crucible assembly relative to said seed holder.

3. An apparatus for growing crystals according to claim 1 wherein said crucible assembly is disposed in a lower portion of said chamber and said thermal shield limits heat loss from said lower portion of said chamber to an upper portion of said chamber.

4. An apparatus for growing crystals according to claim 1 wherein said thermal shield includes several sections which abut one another to form a generally ring-shaped annulus.

5. An apparatus for growing crystals according to claim 4 wherein said sections are selectively joinable to form annuli of varying diameters.

6. An apparatus for growing crystals, comprising:
a sealed chamber having a crucible assembly and a seed holder disposed therein, said seed holder being selectively positionable within said chamber from a first position relative to said crucible assembly to at least one subsequent position within said crucible assembly, said crucible assembly adapted to contain a melt therein;
a heater sufficiently configured and dimensioned to heat said melt disposed within said crucible assembly;
an insulator for insulating said heater and said crucible assembly;
an actuator for rotating at least one of said crucible assembly and said seed bolder relative to the other; and
a support ring for suspending said crucible assembly within said sealed chamber; said support ring having at least one wall being made from a generally ring-shaped ceramic material having a low coefficient of thermal expansion and providing insulation primarily from above said crucible assembly.

7. An apparatus for growing crystals according to claim 6 wherein said ceramic material is monolithic.

8. An apparatus for growing crystals according to claim 6 wherein said ceramic material is sufficient heat resistant.

9. A method of growing crystals, comprising the steps of:
providing a sealed chamber having upper and lower chambers, a crucible assembly, a heater and a seed holder for holding a seed disposed therein, said crucible assembly being mountable atop a support ring and said heater and said crucible assembly being substantially surrounded by an insulating material;
mounting said crucible assembly atop said support ring in the lower portion of the chamber;
placing a ceramic thermal shield having a low coefficient of thermal expansion atop said support ring providing insulation primarily from above said crucible assembly to limit heat loss to the upper portion of said chamber;
placing an initial material into a holder within said crucible assembly;
rotating at least one of said crucible assembly and said seed holder relative to the other of said crucible assembly and said seed holder;
establishing an environmental condition within said chamber;
energizing the heater to melt the initial material;
lowering the seed holder into said melt until a preset condition is met; and
pulling the seed holder and the seed from said crucible at a predetermined pulling rate to pull a single crystal from said melt having a predetermined diameter.

10. A method of growing crystals, comprising the steps of:
providing a sealed chamber having a crucible assembly, a heater and a seed holder for holding a seed disposed therein, said crucible assembly being mountable atop a monolithic ceramic support annulus and said heater and said crucible assembly being substantially surrounded by an insulating material;
mounting said crucible assembly atop said monolithic ceramic support annulus, said support annulus providing insulation primarily from above said crucible assembly;
placing an initial material into a holder within said crucible assembly;
rotating at least one of said crucible assembly and said seed holder relative to the other of said crucible assembly and said seed holder;
establishing an environmental condition within said chamber;
energizing the heater to melt the initial material;
lowering the seed holder into said melt until a preset condition is met; and
pulling the seed holder and the seed from said crucible at a predetermined pulling rate to pull a single crystal from said melt having a predetermined diameter.

* * * * *